US008289192B2

(12) United States Patent
O'Donnell

(10) Patent No.: US 8,289,192 B2
(45) Date of Patent: Oct. 16, 2012

(54) KEYPAD DEVICE HAVING A REMOVABLE BUTTON ASSEMBLY

(75) Inventor: Brian R. O'Donnell, Alburtis, PA (US)

(73) Assignee: Lutron Electronics Co., Inc., Coopersburg, PA (US)

( * ) Notice: Subject to any disclaimer, the term of this patent is extended or adjusted under 35 U.S.C. 154(b) by 413 days.

(21) Appl. No.: 12/692,235

(22) Filed: Jan. 22, 2010

(65) Prior Publication Data

US 2011/0181446 A1 Jul. 28, 2011

(51) Int. Cl.
*H03M 11/00* (2006.01)

(52) U.S. Cl. .......... 341/22; 200/308; 200/309; 200/310; 200/314

(58) Field of Classification Search ..................... 341/22
See application file for complete search history.

(56) References Cited

U.S. PATENT DOCUMENTS 6,005,308 A * 12/1999 Bryde et al. .................. 307/157
6,660,948 B2 12/2003 Clegg et al.
7,361,853 B2 4/2008 Clegg et al.
7,432,463 B2 * 10/2008 Clegg et al. .................. 200/310
7,641,491 B2 1/2010 Altonen et al.
7,714,790 B1 * 5/2010 Feldstein et al. .............. 343/702
7,796,057 B2 9/2010 Swatsky et al.
7,910,849 B2 * 3/2011 Hibshman et al. ............ 200/344
2007/0096903 A1 5/2007 Hibshman et al.

OTHER PUBLICATIONS

Description of Button Assembly for NT-Style Two-Button Wallstations, which were available to the public in 2000, 4 pages.

* cited by examiner

*Primary Examiner* — Khai M Nguyen
(74) *Attorney, Agent, or Firm* — Mark E. Rose; Philip N. Smith; Bridget L. McDonough

(57) ABSTRACT

A control device, such as a keypad device, for use in a load control system for controlling the power delivered from an AC power source to an electrical load comprises a switch, a yoke fixedly mounted with respect to the switch, and a removable button assembly that may be removed from the control device. The removable button assembly comprises a spring tree having a frame portion and at least one button pivotably coupled to the frame portion. The button assembly is received within a channel of the yoke and is positioned such that the button is operable to actuate the switch when the button is pressed. The button assembly is adapted to slide through the channel, such that the button assembly may be removed from the control device. Accordingly, the button of the control device may be easily changed after installation of the control device.

20 Claims, 9 Drawing Sheets

KEYPAD DEVICE HAVING A REMOVABLE BUTTON ASSEMBLY

BACKGROUND OF THE INVENTION

1. Field of the Invention

The present invention relates to a control device of a load control system for controlling the amount of power delivered from an alternating-current (AC) power source to a plurality of electrical loads, and more particularly, to a keypad device having a removable button assembly.

2. Description of the Related Art

Typical load control systems are operable to control the amount of power delivered to an electrical load, such as a lighting load or a motor load, from an alternating-current (AC) power source. A load control system generally comprises a plurality of control devices coupled to a communication link to allow for communication between the control devices. The load control system includes load control devices operable to control the amount of power delivered to the loads in response to digital messages received via the communication link or from local inputs, such as user actuations of a button. An example of a lighting control system is described in greater detail in commonly-assigned U.S. Pat. No. 6,803,728, issued Oct. 12, 2004, entitled SYSTEM FOR CONTROL OF DEVICES, the entire disclosure of which is hereby incorporated by reference.

Typical prior art load control systems often include one or more keypad devices, which each include a plurality of buttons for receiving user inputs to the load control system. The keypad devices transmit digital messages across the communication link to control the loads coupled to the load control devices in response to actuations of the buttons. In order to identify the function to be performed by any particular button, identifiers (such as descriptive icons or text) are often provided on the buttons of keypad devices. For example, the identifiers may be engraved on the buttons. It may be desirable to change or update the identifiers provided on the buttons after installation of the keypad devices. Therefore, there is a need for a method of easily changing the buttons of a keypad device after installation of the keypad device.

SUMMARY OF THE INVENTION

According to an embodiment of the present invention, a control device for use in a load control system for controlling the power delivered from an AC power source to an electrical load comprises a switch, a yoke fixedly mounted with respect to the switch, and a removable button assembly that may be removed from the control device. The removable button assembly comprises a spring tree having a frame portion and at least one button pivotably coupled to the frame portion. The button assembly is received within a channel of the yoke and is positioned such that the button is operable to actuate the switch when the button is pressed. The button assembly is adapted to slide through the channel, such that the button assembly may be removed from the control device.

Other features and advantages of the present invention will become apparent from the following description of the invention that refers to the accompanying drawings.

BRIEF DESCRIPTION OF THE DRAWINGS

The invention will now be described in greater detail in the following detailed description with reference to the drawings in which.

DETAILED DESCRIPTION OF THE INVENTION

Figure 1:
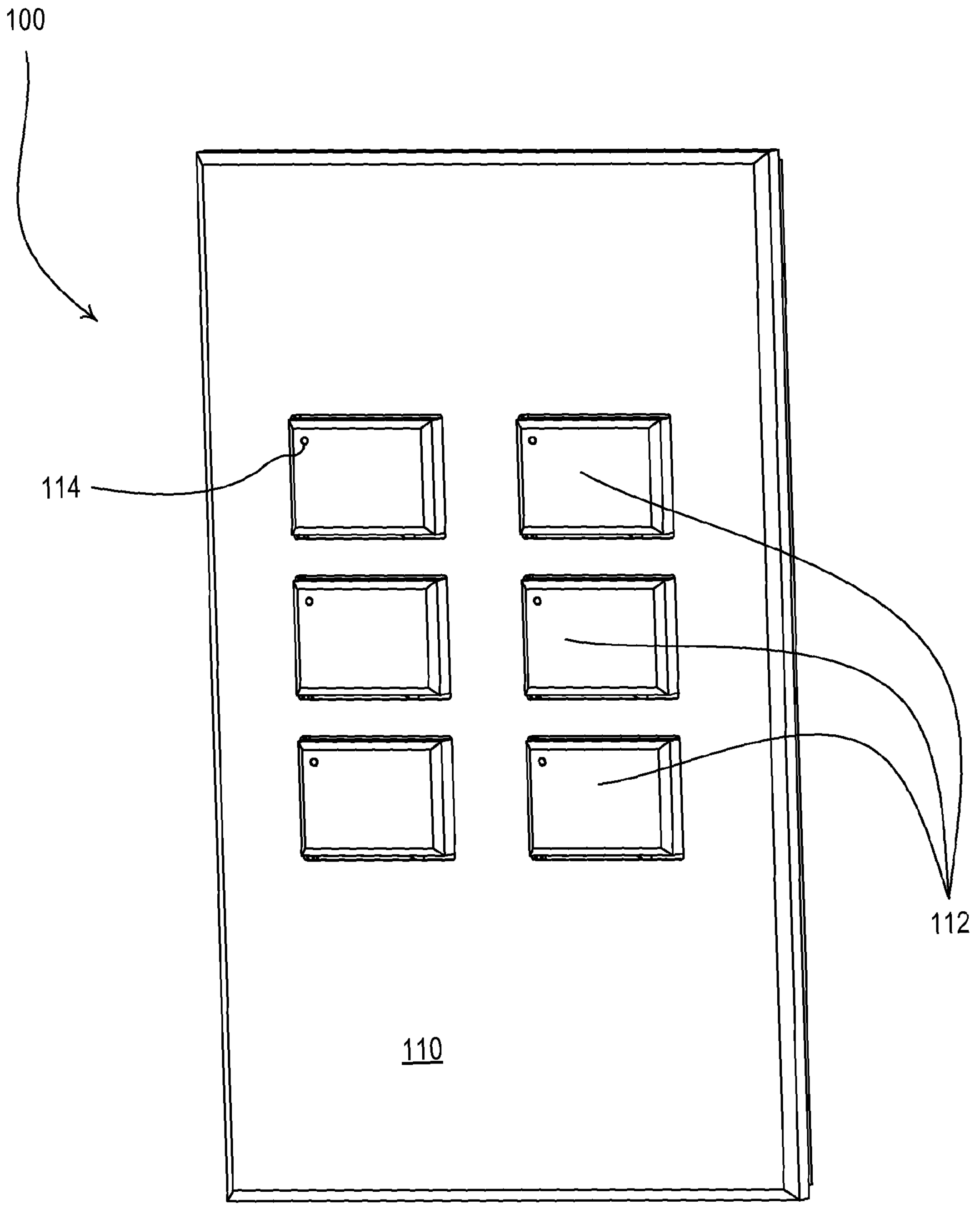
FIG. 1 is a perspective view of a keypad device according to an embodiment of the present invention.

The foregoing summary, as well as the following detailed description of the preferred embodiments, is better understood when read in conjunction with the appended drawings. For the purposes of illustrating the invention, there is shown in the drawings an embodiment that is presently preferred, in which like numerals represent similar parts throughout the several views of the drawings, it being understood, however, that the invention is not limited to the specific methods and instrumentalities disclosed.

FIG. 1 is a perspective view of a wall-mountable keypad device 100 according to an embodiment of the present invention. The keypad device 100 may be used as part of a load control system having one or more load control devices (not shown) for controlling the amount of power delivered to a plurality of electrical loads (not shown), such as lighting loads or motor loads. The keypad device 100 may be wall-mounted to a standard electrical wallbox (not shown). The keypad device 100 comprises a faceplate 110 and a plurality of buttons 112 (e.g., six buttons). In response to actuations of the buttons 112, the keypad device 100 may transmit digital messages to the load control devices of the load control system via a communication link, for example, a wired communication link or a wireless communication link, such as a radio-frequency (RF) communication link or an (IR) communication link. The load control devices are operable to adjust the amount of power being delivered to the electrical loads in response to receiving the digital messages from the keypad device 100. Each of the buttons 112 of the keypad device 100 comprises a visual indicator 114, which may be illuminated to provide feedback of the status of the electrical loads of the load control system. Examples of load control systems are described in greater detail in co-pending, commonly-assigned U.S. patent application Ser. No. 11/703,912, filed Feb. 8, 2007, entitled METHOD OF TRANSMITTING A HIGH-PRIORITY MESSAGE IN A LIGHTING CONTROL SYSTEM, and U.S. patent application Ser. No. 12/033,223, filed Feb. 19, 2008, entitled COMMUNICATION PROTOCOL FOR A RADIO-FREQUENCY LOAD CONTROL SYSTEM, the entire disclosures of which are hereby incorporated by reference.

Figure 2:
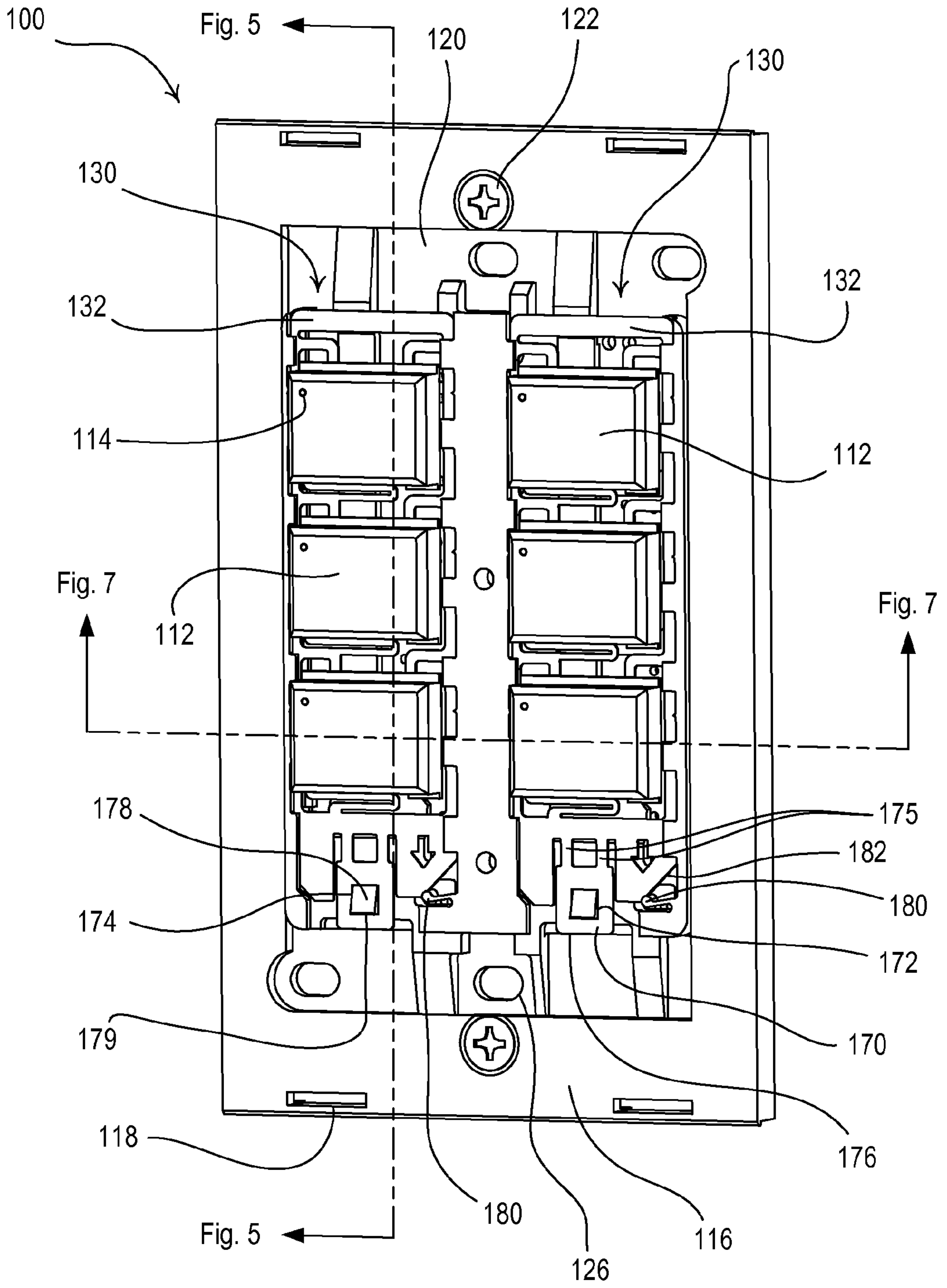
FIG. 2 is a perspective view of the keypad device of FIG. 1 with a faceplate removed showing two button assemblies of the keypad device.

FIG. 2 is a perspective view of the keypad device 100 with the faceplate 110 removed. The keypad device 100 comprises an adapter 116 having attachment openings 118. The rear surface of the faceplate 110 comprises snaps (not shown) which are received in the attachment openings 118 of the adapter 116, such that the faceplate may be attached to the keypad device 100 without screws. The adapter 116 is connected to a mounting yoke 120 of the keypad device 100 via screws 122 received in screw openings 124 (FIG. 3) of the yoke. The yoke 120 allows the keypad device 100 to be mounted to the electrical wallbox via screws (not shown) received through mounting openings 126 of the yoke.

Figure 3:
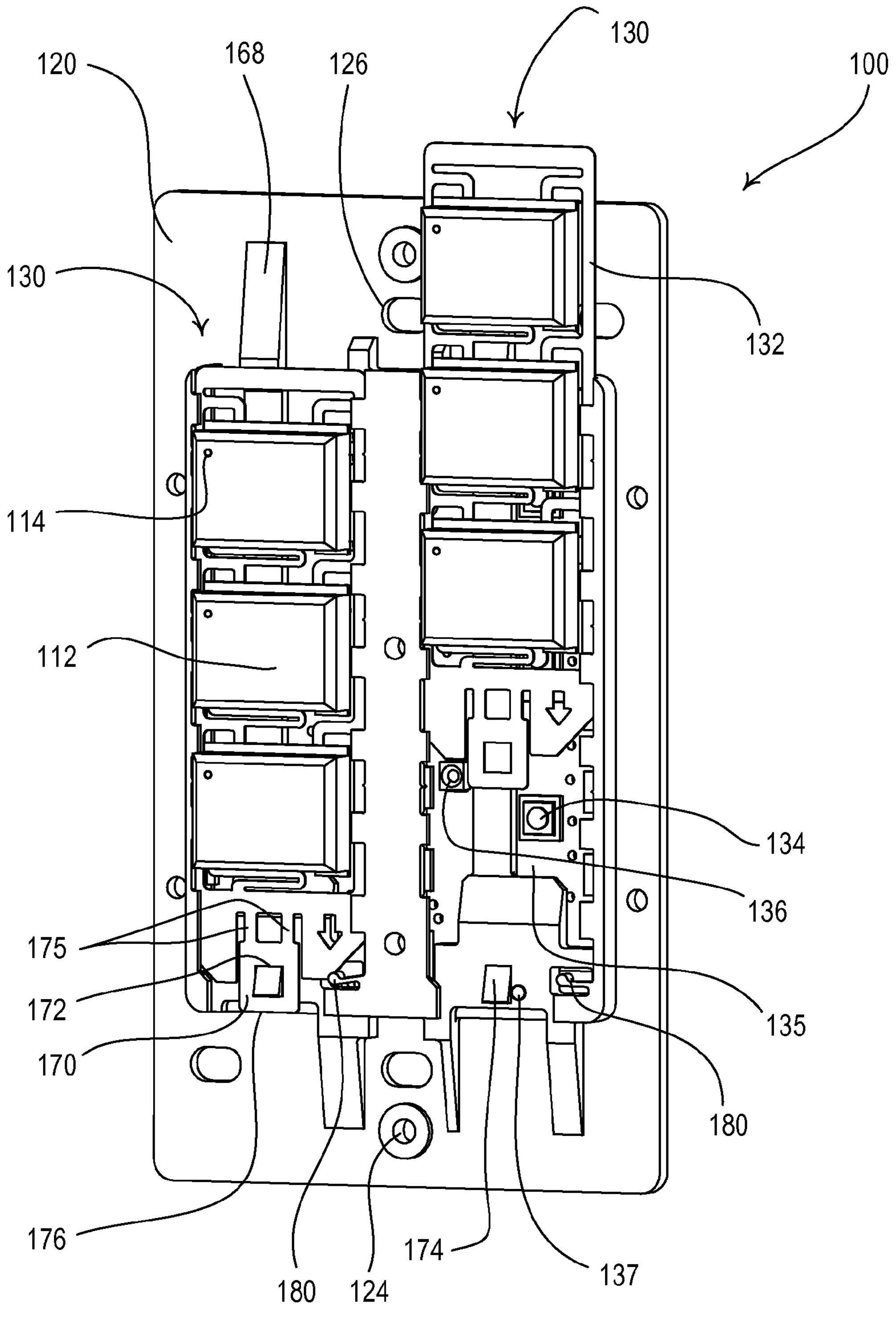
FIG. 3 is a perspective view of the keypad device of FIG. 1 with one of the button assemblies partially removed.
Figure 4:
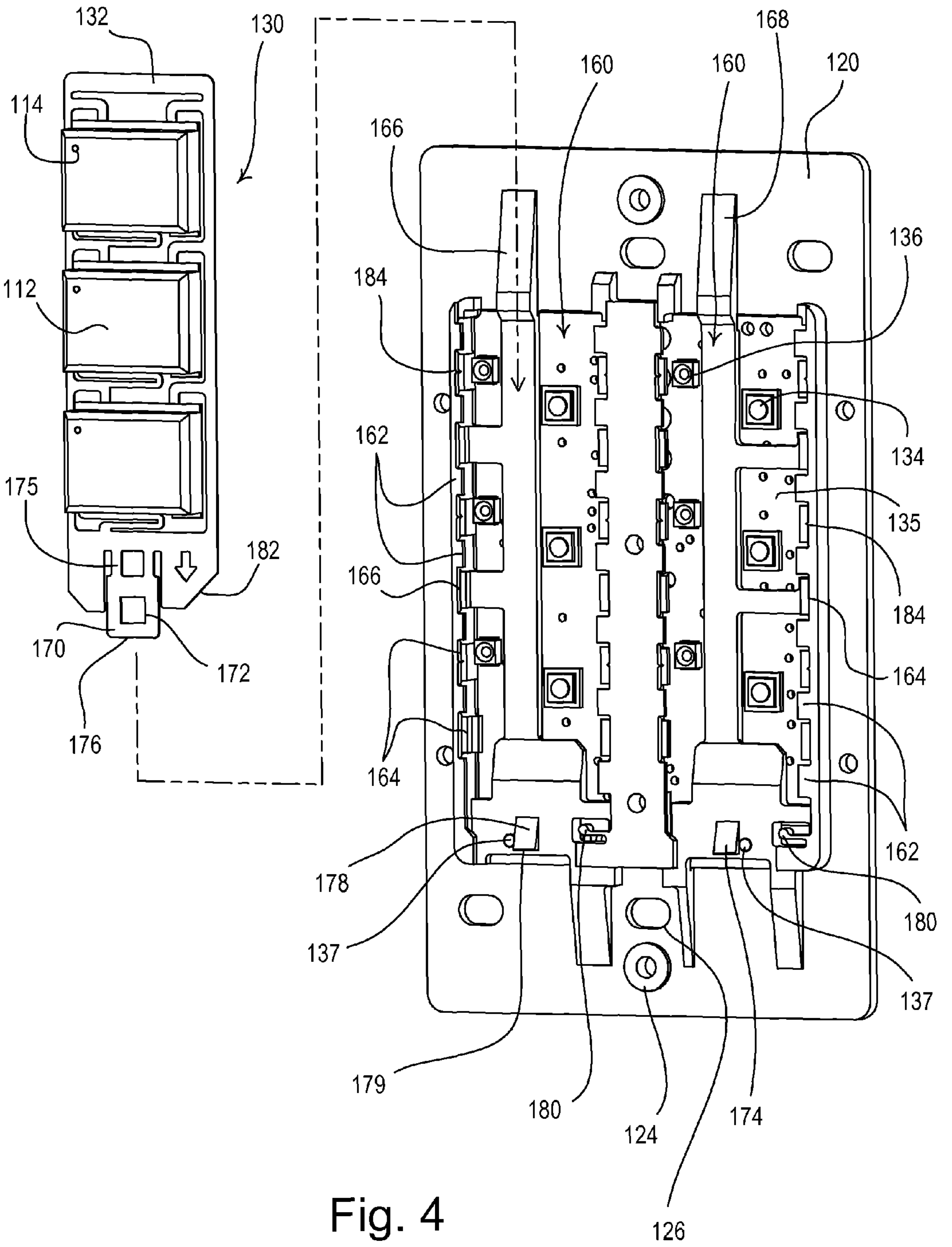
FIG. 4 is a perspective view of one of the button assemblies and the keypad device of FIG. 3 having both of the button assemblies completely removed.
Figure 5:
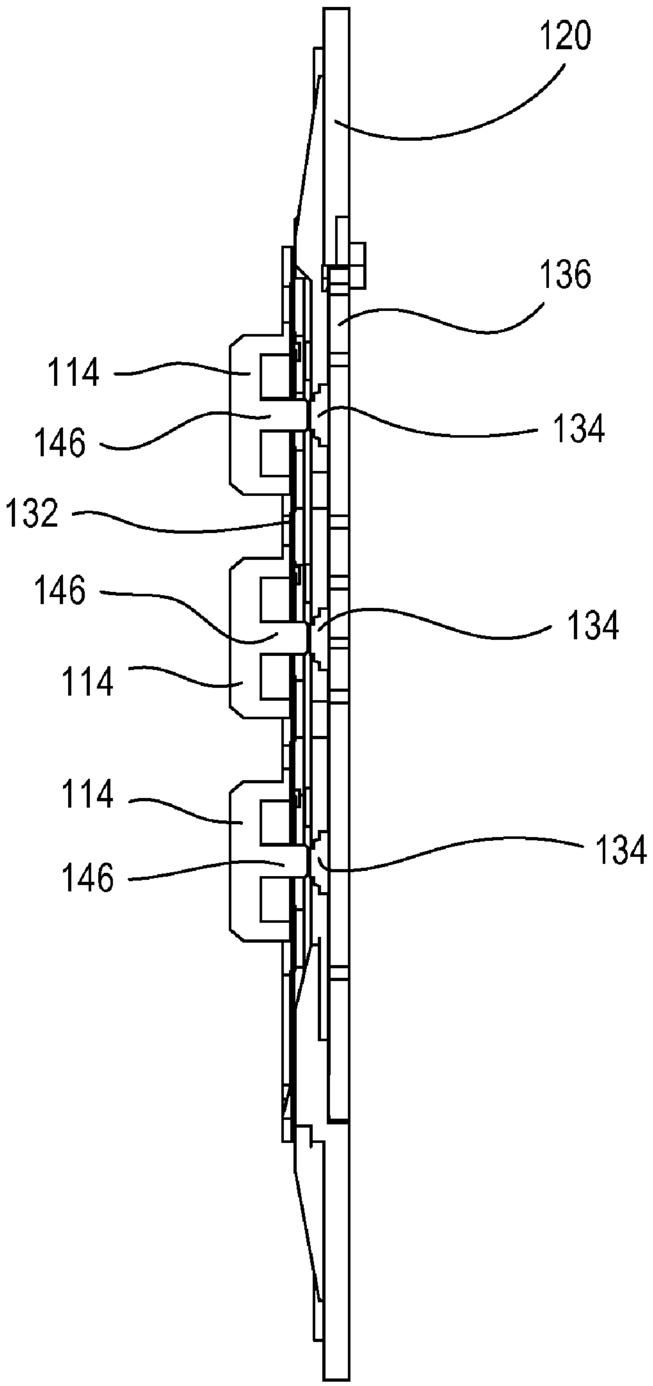
FIG. 5 is a right-side cross-sectional view of the keypad device of FIG. 1 with both of the button assemblies fully installed.

According to the embodiment of the present invention, the keypad device 100 comprises two removable button assemblies 130. Each button assembly 130 comprises one column of buttons 112 of the keypad device 100 (i.e., three buttons), and a spring tree 132, to which the buttons are mounted. FIG. 3 is a perspective view of the keypad device 100 with the adapter 116 removed and one of the button assemblies 130 partially removed. FIG. 4 is a perspective view of one of the button assemblies 130 and the keypad device 100 having both of the button assemblies completely removed. FIG. 5 is a right-side cross-sectional view of the keypad device 100 with the button assemblies 130 installed, but without the faceplate 110 and the adapter 116 (taken through the line shown in FIG. 2).

When the button assemblies 130 are fully installed on the keypad device 100 and one of the buttons 112 is pressed, the button actuates a respective mechanical tactile switch 134 mounted on a printed circuit board (PCB) 135 of the keypad device. The printed circuit board 135 is fixedly mounted to the yoke 120, such that the buttons 112 are positioned immediately above the tactile switches 134 when the button assemblies 130 are installed. As shown in FIG. 4, the keypad device 100 also comprises a plurality of light-emitting diodes (LEDs) 136, which are also mounted to the printed circuit board 135 and operate to illuminate the visual indicators 114 on each of the buttons 112.

Figure 6:
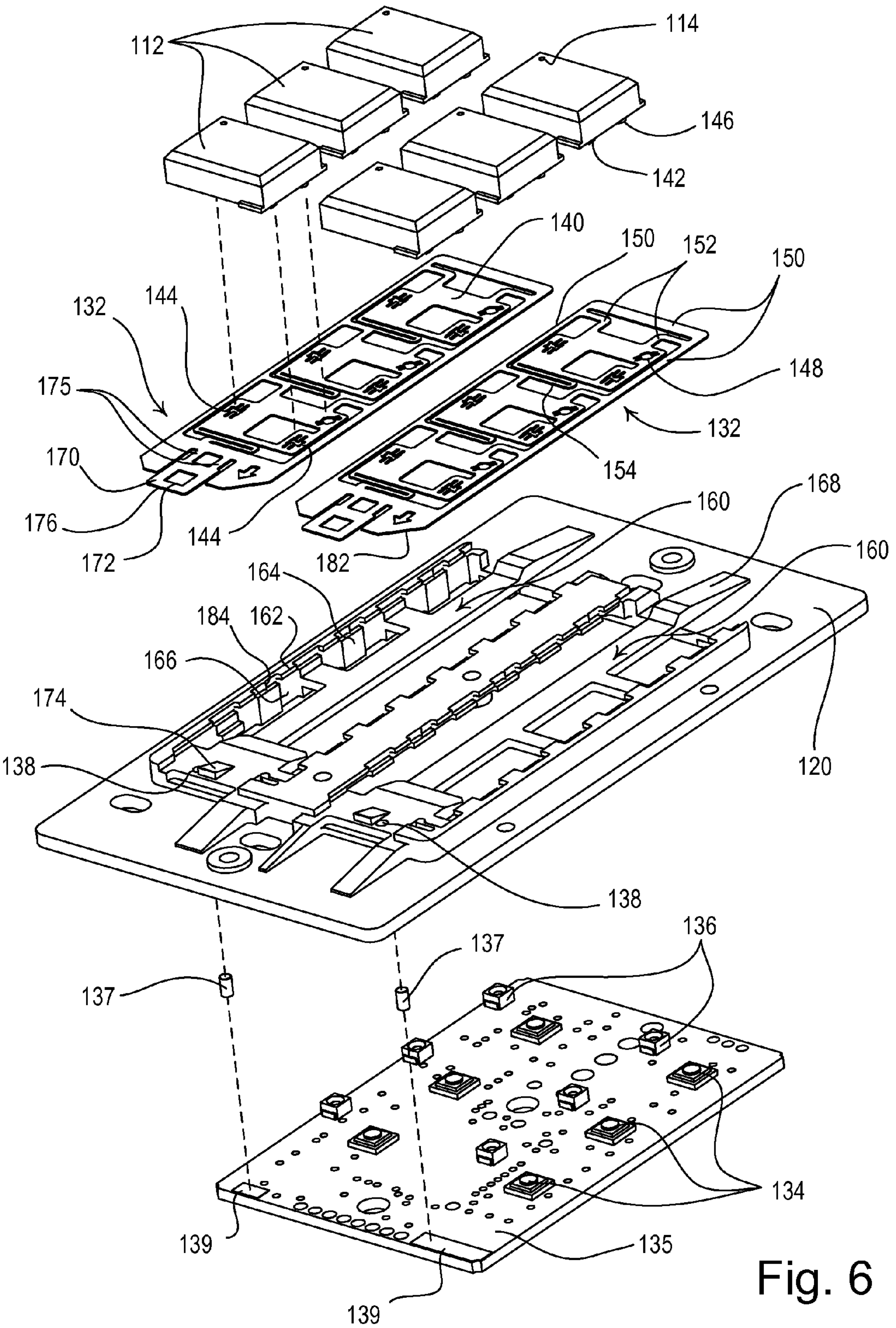
FIG. 6 is an exploded perspective view of the keypad device of FIG. 1.

FIG. 6 is an exploded perspective view of the keypad device 100 showing the spring trees 132, the yoke 120, and the printed circuit board 135 in greater detail. When a user actuates a button 112 of the keypad device 100, the user may discharge built-up static electricity to the keypad device, i.e., an electro-static discharge (ESD) event may occur. When an ESD event occurs, the energy is typically coupled to the spring trees 132 of the keypad device 100 (which are made from a conductive material, such as, for example, stainless steel), and is conducted to ground through the lowest impedance path available in the electrical circuitry of the keypad device. The energy from ESD events may damage the electrical circuitry of the keypad device 100 if the circuitry is not protected appropriately. To provide a low-impedance path to ground, the keypad device 100 comprises ESD conduction posts 137 that are located within ESD conduction apertures 138 in the yoke 120 and are also made from a conductive material (e.g., stainless steel). When the printed circuit board is connected to the yoke 120 and the button assemblies 130 are fully inserted on the keypad device 100, a first end of each conduction post 137 is located adjacent one of the spring trees 132 and a second end of each conduction post is located adjacent one of two conductive pads 139 on the printed circuit board 135. The conductive pads 139 may be directly electrically coupled to or capacitively coupled to the ground connection of the external power source of the keypad device 100. Therefore, the ESD conduction posts 137 provide low-impedance paths to ground that are not through the electrical circuitry of the keypad device 100, such that the electrical circuitry may not be damaged during ESD events.

Figure 7:
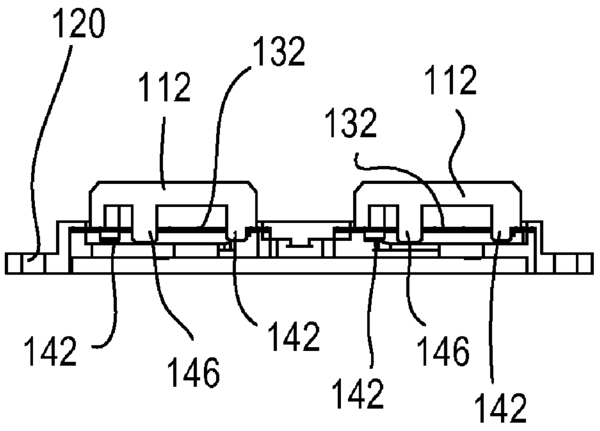
FIG. 7 is a bottom cross-sectional view of the keypad device of FIG. 1 with both of the button assemblies fully installed.

FIG. 7 is a bottom cross-sectional view of the yoke 120 with both of the button assemblies 130 installed (taken through the line shown in FIG. 2) showing how the buttons 112 are attached to the spring trees 132. Each of the buttons 112 is attached to a respective spring plate 140 (FIG. 6) of the spring trees 132. Specifically, each button 112 comprises two attachment posts 142 that are received through attachment openings 144 of the spring plates 140 of the spring tree 132. The attachment openings 144 comprise fingers that operate to permanently affix the buttons 112 to the spring trees 132. Each button 112 comprises an actuation post 146 that extends through an opening 148 (FIG. 6) of the respective spring plate 140 to allow for actuation of the respective tactile switch 134 on the printed circuit board 135 when the button is pressed.

As shown in FIG. 6, each spring tree 132 comprises a frame portion 150 that surrounds the perimeter of the spring tree. The spring plates 140 are each attached to the frame portion 150 via two cantilevered spring arms 152. When one of the buttons 112 is actuated, the spring arms 152 allow the respective spring plate 140 to pivot with respect to the frame portion 150, such that the actuation post 146 of the button may actuate the respective tactile switch 134 on the printed circuit board 135. The spring trees 132 also comprise U-shaped springs 154 that are attached to the spring plates 140 on the sides opposite the cantilevered spring arms 152. The U-shaped springs 154 operate to reduce audible "twang" (i.e., noise) when the buttons 112 are actuated.

The button assemblies 130 are operable to slide into channels 160 formed in the yoke 120 as shown in FIGS. 3 and 4. Specifically, the frame portion 150 of each spring tree 132 is received by a plurality of tabs 162 and supports 164 that extend from sidewalls 166 of the channels 160. The frame portion 150 of each button assembly 130 is firmly held in place in the channels 160 by the tabs 162 and the supports 164. According to the embodiment of the present invention, the button assemblies 130 are adapted to be inserted into the channels 160 from the top of the yokes 120. The yokes 120 comprise sloped structures 168 for guiding the frame portion 150 of the spring tree 132 to be received between the tabs 162 and the supports 164. Each button assembly 130 may be pushed in a downward direction, such that the spring tree 132 slides through the channel 160 until the button assembly is fully installed on the keypad device 100.

The spring trees 132 of the button assemblies 130 each further comprise snaps 170 that operate to hold the buttons assemblies in place in the channels 160 of the yoke 120. Each snap 170 comprises a snap opening 172 that is adapted to be coupled to a snap tab 174 formed in the yoke 120. The snaps 170 are each connected to the frame portion 150 of the respective spring tree 132 via cantilevered snap spring arms 175. When one of the button assemblies 130 is inserted into the respective channel 160 and pushed in the downward direction, a bottom edge 176 of the snap 170 contacts a sloped surface 178 of the respective snap tab 174. As the button assembly 130 is pushed down, the snap 170 pivots about the snap spring arms 175 and the snap translates across the sloped surface 178 until the snap tab 174 is received into the snap opening 172. When the snap tab 172 is received in the snap opening 172, an end surface 179 of the snap tab contacts the bottom edge of the snap opening, such that the button assembly 130 is locked in place.

The yoke 120 further comprises biasing members 180, which are pivotably coupled to one of the sidewalls 166 of each of the channels 160. Each biasing member 180 contacts a bottom surface 182 of the spring tree 132 to push the button assembly 130 in a upward direction, such that the bottom edge of the snap opening 172 contacts the end surface 179 of the snap tab 174. Accordingly, the button assembly 130 is firmly held in place by the biasing member 180 and the end surface 179 of the snap tab 174. The biasing member 180 also operates to reduce audible twang when the buttons 112 are actuated.

To remove one of the button assemblies 130 from the keypad device 100, the snap 170 lifts away from the yoke 120 as the button assembly is pulled in the upward direction, such that the snap pivots about the snap spring arms 175 and the snap opening 172 is decoupled from the snap tab 174. The button assembly 130 may then be pushed in the upward direction, such that the snap opening 172 moves over the end surface 179 of the snap tab 174. Accordingly, the spring tree 132 may then slide through the channel 160, such that the button assembly 130 may be removed from the keypad device 100.

Figure 8A:
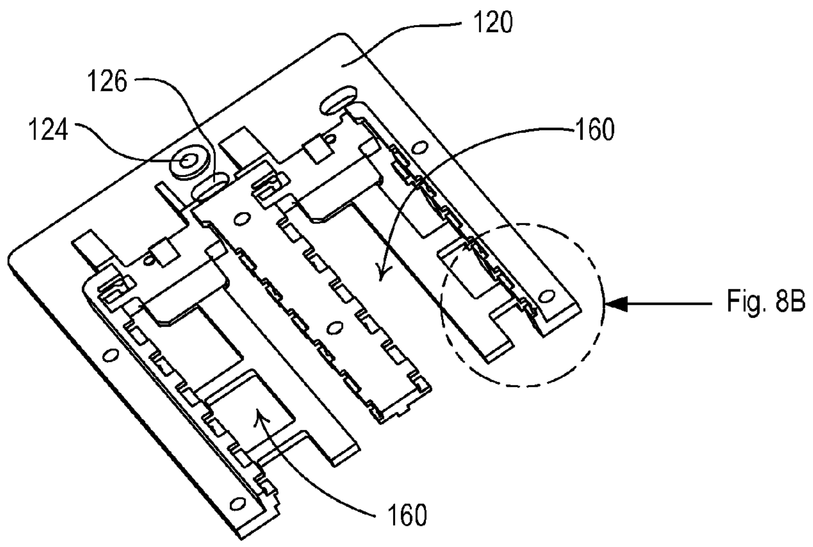
FIG. 8A is a perspective cross-sectional view of a yoke of the keypad device of FIG. 1.
Figure 8B:
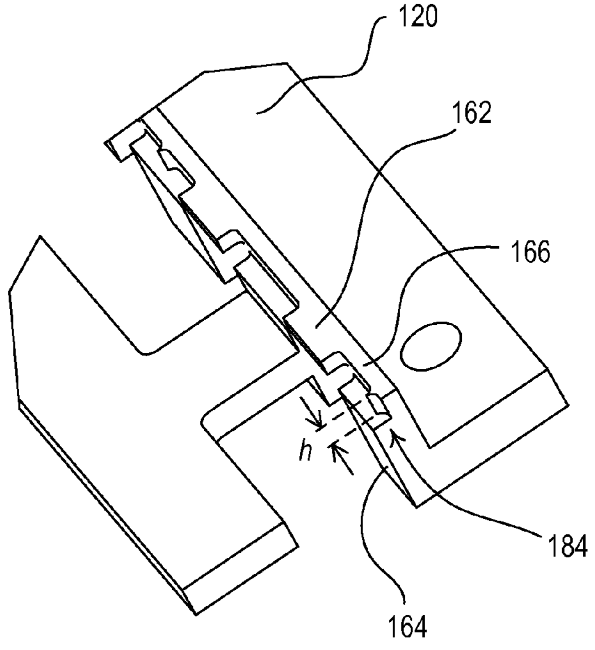
FIG. 8B is an enlarged section of the perspective view of FIG. 8A.
Figure 9A:
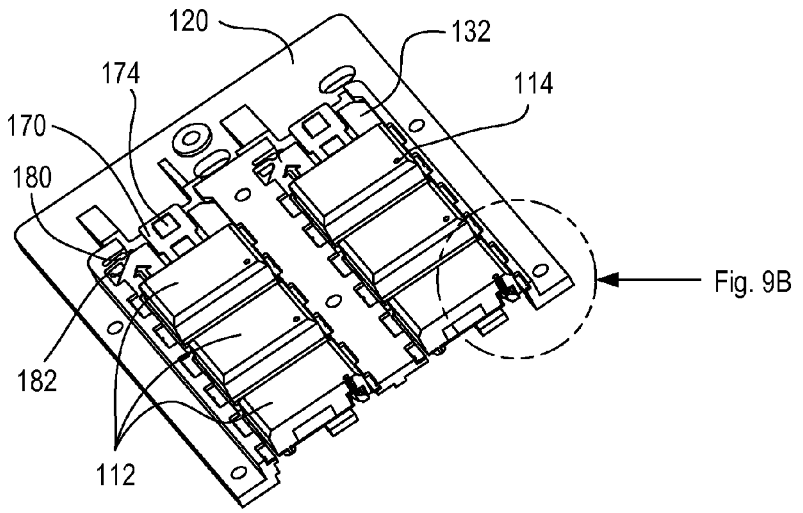
FIG. 9A is a perspective cross-sectional view of the yoke of FIG. 8A with the button assemblies installed.
Figure 9B:
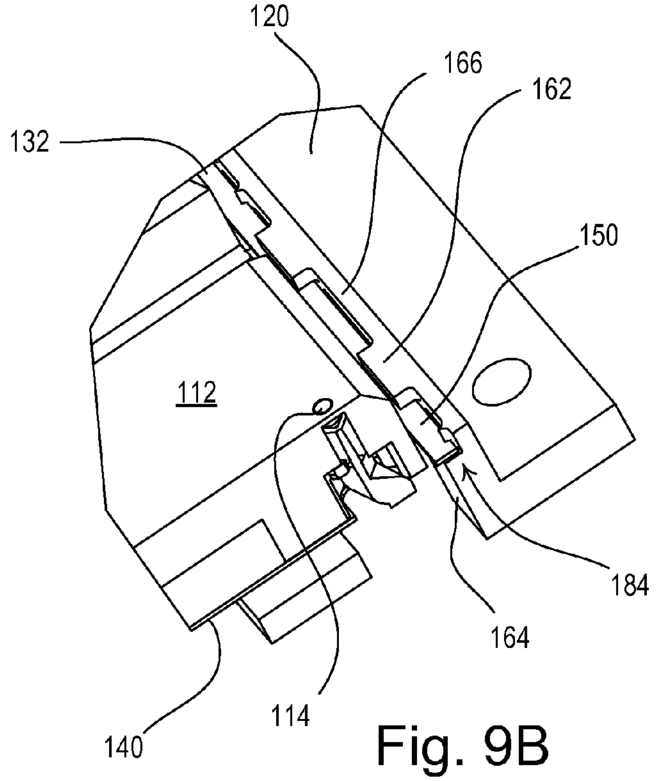
FIG. 9B is an enlarged section of the perspective view of FIG. 9A.

The yoke 120 further comprises extensions 184 that protrude from the side walls 166 of the channels 160. FIG. 8A is a perspective cross-sectional view of the yoke 120, and FIG. 8B is an enlarged section of the perspective view of FIG. 8A showing one of the extensions 184 in greater detail. The extensions 184 extend from the supports 164 of the yoke 120 (in a direction away from the front of the keypad device 100), such that each extension has a height h (as shown in FIG. 8B) that is greater than the thickness of the spring trees 132. FIG. 9A is a perspective cross-sectional view of the yoke 120 with the button assemblies 130 installed, and FIG. 9B is an enlarged section of the perspective view of FIG. 9A. The extensions 184 are appropriately thin, such that the frame portions 150 of the spring trees 132 break through the extensions when the button assemblies 130 are inserted into the channels 160 as shown in FIG. 9B. Accordingly, the spring trees 132 become wedged between the remaining portion of the extensions 184 and the supports 164 of the yoke 120 (with tighter tolerances than with which the spring trees are received between the tabs 162 and the supports 164). The extensions 184 operate to hold the button assemblies 130 in place and to further reduce audible twang when the buttons 112 are actuated.

While the present invention has been described with reference to the wall-mounted keypad device 100, the removable button assemblies 130 could be used on other control devices of the load control system, such as, for example, wall-mounted dimmer switches, motor control units, multi-zone load control units, or table-top keypad devices or load control units.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A control device for use in a load control system for controlling the power delivered from an AC power source to an electrical load, the control device comprising:

a switch;

a yoke fixedly mounted with respect to the switch, the yoke comprising a channel; and a removable button assembly comprising a spring tree having a frame portion and at least one button pivotably coupled to the frame portion, the button assembly received within the channel of the yoke and positioned such that the button is operable to actuate the switch when the button is pressed, the button assembly adapted to slide through the channel, such that the button assembly may be removed from the control device.

2. The control device of claim 1, further comprising:

a printed circuit board fixedly mounted to the yoke;

wherein the mechanical switch comprises a tactile switch mounted on the printed circuit board.

3. The control device of claim 2, wherein the spring tree further comprises a snap having an opening receiving a snap tab formed in the yoke, such that the spring tree is locked in place when the snap tab is received in the opening of the snap.

4. The control device of claim 3, wherein the snap is coupled to the frame portion of the spring tree via cantilevered spring arms, such that the snap is operable to pivot with respect to the frame portion.

5. The control device of claim 4, wherein the snap may be pulled away from the yoke, such that the opening of the snap is decoupled from the snap tab and the button assembly may be slid through the channel of the yoke and removed from the control device.

6. The control device of claim 5, wherein the snap tab comprises a sloped surface and an end surface, the snap adapted to contact the sloped surface of the snap tab when the button assembly is being installed on the keypad device and the spring tree is being slid through the channel towards the snap tab, such that snap pivots about the spring arms and translates across the sloped surface until the snap tab is received in the opening of the snap, the end surface of the snap tab adapted to contact the edges of the opening to lock the button assembly in place.

7. The control device of claim 6, wherein the yoke further comprises a biasing member pivotably coupled to the channel and operable to push the spring tree in a direction, such that an edge of the opening contacts the end surface of the snap tab.

8. The control device of claim 2, wherein the channel of the yoke comprises a plurality of tabs and a plurality of supports, the frame portion of the spring tree received between the tabs and the supports.

9. The control device of claim 8, wherein the channel of the yoke comprises a plurality of extensions, the frame portion of the spring tree adapted to break through the extensions and to be held in place by the remaining portions of the extensions.

10. The control device of claim 9, wherein the extensions are located adjacent the supports of the yoke, such that the frame portion of the spring tree is held in place between the remaining portions of the extensions and the adjacent supports.

11. The control device of claim 8, wherein the yoke comprises sloped structures for guiding the frame portion of the spring tree to be received between the tabs and the supports.

12. The control device of claim 2, wherein the spring tree is made from a conductive material, the control device further comprising at least one ESD conduction post made from a conductive material and coupled between the spring tree and the printed circuit board for conducting energy from an ESD event to a ground connection.

13. The control device of claim 1, wherein the control device comprises a keypad device.

14. The control device of claim 13, wherein the button assembly comprises a plurality of buttons.

15. The control device of claim 14, wherein the plurality of buttons are arranged in a column on the keypad device.

16. The control device of claim 14, further comprising:

a second button assembly received within a second channel of the yoke and having a plurality of buttons;

wherein the two button assemblies are arranged as two columns on the keypad device.

17. The control device of claim 13, wherein the keypad device comprises a wall-mounted keypad.

18. A wall-mounted keypad device for use in a load control system for controlling the power delivered from an AC power source to an electrical load, the keypad device comprising:

a yoke adapted to be mounted to an electrical wallbox, the yoke comprising a channel;

a printed circuit board fixedly mounted to the yoke;

a tactile switch mounted to the printed circuit board; and a removable button assembly comprising a spring tree having a frame portion and at least one button pivotably coupled to the frame portion, the button assembly received within the channel of the yoke and positioned such that the button is operable to actuated the tactile switch when the button is pressed, the button assembly adapted to slide through the channel, such that the button assembly may be removed from the keypad device.

19. The control device of claim 18, wherein the spring tree further comprises a snap coupled to the frame portion of the spring tree via cantilevered spring arms allowing the snap to pivot with respect to the frame portion, the snap having an opening receiving a snap tab formed in the yoke for locking the spring tree in place.

20. The control device of claim 18, wherein the channel of the yoke comprises a plurality of tabs and a plurality of supports, the frame portion of the spring tree received between the tabs and the supports, the channel of the yoke further comprising a plurality of extensions, the frame portion of the spring tree adapted to break through the extensions and to be held in place by the remaining portions of the extensions.

* * * * *